United States Patent [19]

Walker

[11] Patent Number: 4,564,811
[45] Date of Patent: Jan. 14, 1986

[54] RF CORE ANALYZING MEANS AND METHOD

[75] Inventor: Robert N. Walker, Houston, Tex.

[73] Assignee: Texaco Inc., White Plains, N.Y.

[21] Appl. No.: 519,430

[22] Filed: Aug. 1, 1983

[51] Int. Cl.$^4$ ............................................. G01R 33/08
[52] U.S. Cl. ..................................... 324/307; 324/300; 436/31; 436/173; 422/69
[58] Field of Search ............... 324/300, 303, 376, 377, 324/307; 436/173, 31; 422/69

[56] References Cited

U.S. PATENT DOCUMENTS

| 4,267,620 | 5/1981 | Allen | 19/239 |
| 4,389,613 | 6/1983 | Brown | 324/303 |
| 4,424,487 | 1/1984 | Lauffer | 324/307 |

Primary Examiner—Stewart J. Levy
Assistant Examiner—Robert R. Raevis
Attorney, Agent, or Firm—Robert A. Kulason; Ronald G. Gillespie

[57] ABSTRACT

A core analyzer includes a test cell containing a core of earthen material. The core has a length suitable for monitoring fluid moving through the core. Apparatus provides at least two fluids to the test cell in such a manner that a first fluid fills the core in the test cell and a second fluid displaces at least a portion of the first fluid. Other apparatus uses nuclear magnetic resonance to monitor the saturation of the core with the first fluid and to monitor the displacing movement of the second fluid.

13 Claims, 3 Drawing Figures

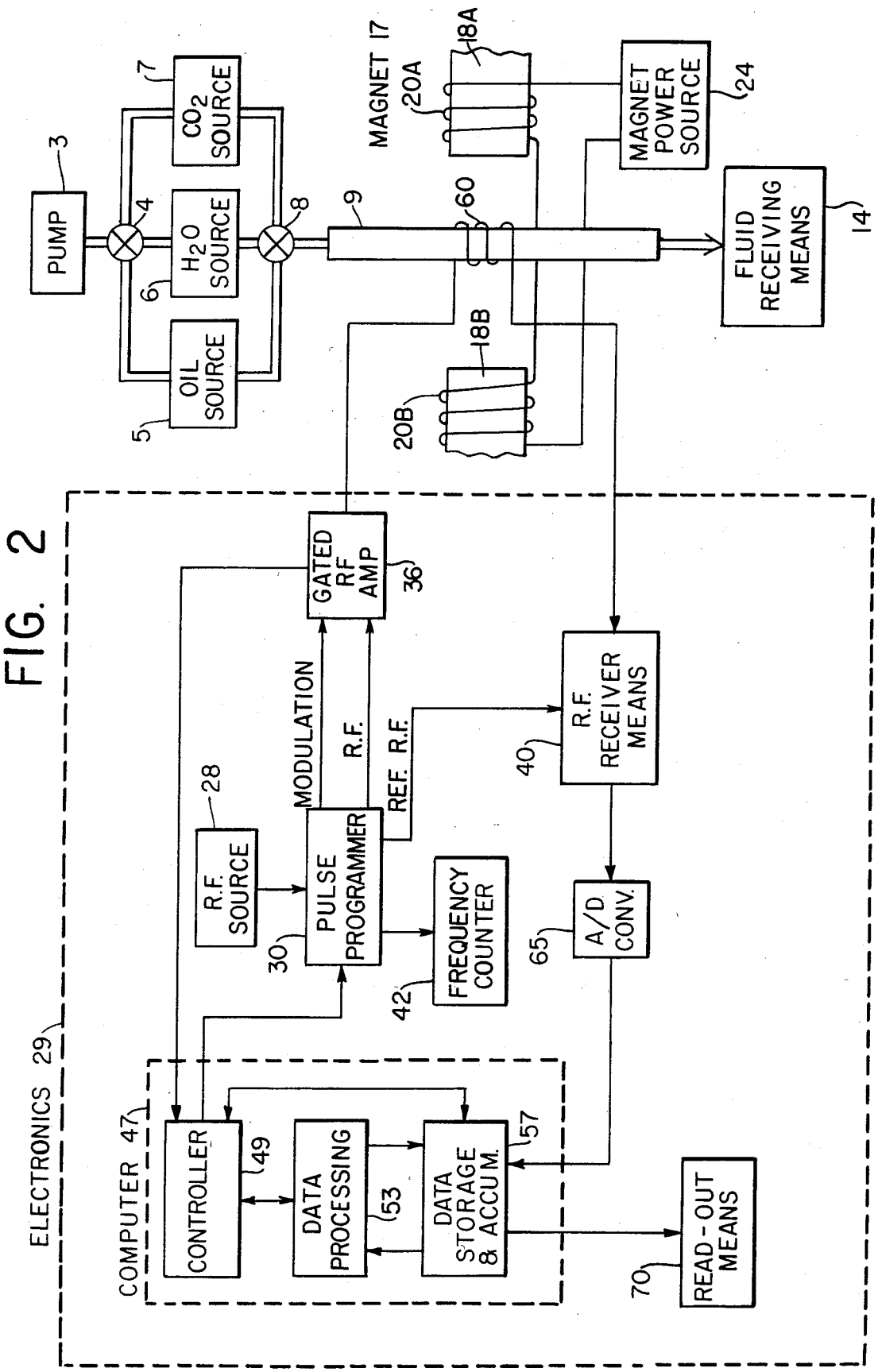

RF CORE ANALYZING MEANS AND METHOD

BACKGROUND OF THE INVENTION

Field of the Invention

The present invention relates to core analysis in general and more particularly to core flood analysis.

SUMMARY OF THE INVENTION

A core analyzer includes a test cell containing a core of earthen material. The core has a length suitable for monitoring fluid moving through the core. Apparatus provides at least two fluids to the test cell in such a manner that a first fluid fills the core in the test cell and a second fluid displaces at least a portion of the first fluid. Other apparatus uses nuclear magnetic resonance to monitor the saturation of the core with the first fluid and to monitor the displacing movement of the second fluid.

The objects and the advantages of the invention will appear more fully hereinafter from a consideration of the detailed description which follows, taken together with the accompanying drawings wherein one embodiment of the present invention is illustrated by way of example. It is to be expressly understood, however, that the drawings are for illustration purposes only and are not to be construed as defining the limits of the invention.

DESCRIPTION OF THE DRAWINGS

FIG. 2 is a simplified block diagram of a core analyzer constructed in accordance with the present invention.

DESCRIPTION OF THE INVENTION

In the study of enhanced recovery of oil from reservoirs, it is often convenient to conduct flow studies utilizing representative rock or sand core material. The dynamics of the displacement of oil from the core by injected flooding agent, such as carbon dioxide or aqueous surfactant solution, is still unclear. In particular, the distribution of oil during and after the flood is difficult to determine, especially for a high pressure flood where high pressure pipe is often used as a barrel surrounding the core.

There are several methods currently in use to determine oil saturation within a core, but they all have limited applicability. Material balance calculations are probably the most common method for determining oil saturation in a core. This method gives an accurate value for the oil saturation of the entire core, but give no information concerning the distribution of that oil within the core.

The core can be destroyed after a flood and the core material examined to determine oil saturation. This allows some knowledge of oil distribution but is unpopular because the destruction of the core precludes the possibility of reuse. Also, this method cannot be used to determine oil saturation during the course of a flood.

Recently, a method for determining water saturation has been developed based upon the attenuation of a microwave beam by water remaining within the core. In some flooding systems, such as low concentration aqueous surfactant floods, it is possible to calculate oil saturation from water saturation directly, since there are essentially only two components present, water and oil. For flooding systems with more than one non-aqueous component, the microwave method does not allow the calculation of oil saturation.

The present invention uses a nuclear magnetic resonance technique to determine oil saturation in a core directly. This is accomplished by placing the core in a suitable electromagnetic environment and observing the proton free precession of protons in the hydrocarbon molecules. The theory is as follows:

if a material possessing nuclei with nuclear spin is placed within a constant magnetic field, the direction of the spins and hence the magnetic moments of the nuclei will be polarized in the direction of the magnetic field, the polarization, or magnetization, of the material approaching a maximum value as a function of time. If the external polarizing magnetic field is suddenly turned off and the spins are placed in a magnetic field $H_o$, hereinafter referred to as the precessing magnetic field, oriented perpendicular to the direction of existing magnetization, the spins will precess about $H_o$, with a characteristic frequency given by the Larmor frequency of precession $$f_o = \nu H_o$$

where $$\nu = 4.2576 \times 10^3 \text{ Hz/G}.$$

Figure 1:
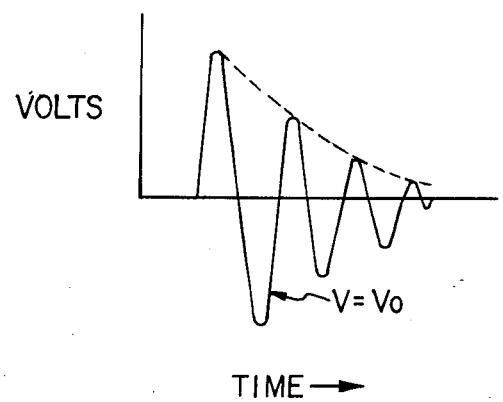
FIG. 1 is a graphical representation of a typical decaying RF signal due to nuclear magnetic resonance.

An induction coil placed around the sample with the axis of the coil oriented non-parallel to $H_o$ will experience an induced voltage at the Larmor frequency of the precessing spins. The voltage will be proportional to the number of spins precessing and the signal amplitude envelope will decay to zero with a characteristic relaxation time as the magnetization of the sample decays to a value governed by $H_o$. A typical induced voltage is shown in FIG. 1.

With reference to FIG. 2, a pump 3 pumps distilled water to a multiport valve 4, which may be manually or automatically controlled, to an oil source 5, to a water source 6 or to a $CO_2$ source 7. Sources 5, 6 and 7 may be of the type which includes a conventional type free floating piston in containers (not shown) having oil, water and $CO_2$, respectively. The pumped-in distilled water causes the piston to expel the fluid from either oil source 5, water source 6, or $CO_2$ source 7 to another multiport valve 8 which cooperates with valve 4 to provide the expelled fluid to a test cell 9. Test cell 9 has a core (not shown) of earthen material which may be from a petroleum reservoir which will be subjected to the enhanced oil recovery process or may be a substitute material suitably selected for it characteristics. Fluid is pumped through cell 9 to fluid receiving means 14. Receiving means 14 may be just a container to hold the fluids for proper disposal or it may represent separate containers with a valve cooperating with valves 4, 8 to separate and save the fluids for future use.

Spatially related to test cell 9 is an electromagnet 17 comprising one pole 18A and another pole 18B. Test cell 9 is between poles 18A and 18B. A precessing magnetic field is created by energization of coils 20A and 20B with power from a magnet power supply 24. As noted previously, electromagnet 17 may be omitted in which case the earth's magnetic field will be the precessing magnetic field, however, at the cost of the signal-to-noise ratio.

An RF energy source 28 provides a voltage at an RF frequency, preferably in a range of from 2 KHz up to but not including the microwave frequencies, to a pulse programmer 30. Programmer 30 provides a modulation control signal and an RF signal to a gated RF amplifier 36. Source 28 may be of the type manufactured by Matec Inc. as their part model 110. Pulse programmer 30 may be of the type sold by Matec Inc. as Model No. 410. Amplifier 36 may be of the type also manufactured by Matec Inc. as their Model 5100/515. Pulse programmer 30 also provides a reference RF signal to RF receiving means 40 and pulses to a frequency counter 42.

A computer 47 includes a controller 49 which receives a signal from gated RF amplifier 36 in accordance with the gating of amplifier 36 and provides a control signal to pulse programmer 30 to control the pulsing of RF energy. Controller 49 is in two-way communication with data processing section 53 and data storage and accumulation section 57.

The output of gated RF amplifier 36 is provided to a coil 60 encircling a portion of test cell 9 and connected to receiving means 40 which may be of the type manufactured by Matec Inc. as Model No. 625. The output of RF receiving means 40 is provided to an analog-to-digital converter 65 which provides digital signals to data storage and accumulation section 57 of computer 47. Data storage and accumulation section 57 of computer 47 also provides digital signals to readout means 70.

In operation RF source 28, pulse programmer 30, gated RF amplifier 36 and controller 49 cooperate to provide pulses of RF voltage to coil 60. Each pulse creates the polarizing magnetic field to polarize the magnetic moments of the nuclei of the core and material in test cell 9. The duration and timing of the pulses are such that, in conjunction with the precessing magnetic field $H_o$, the nuclear spins are polarized in a direction non-parallel to the magnetic field $H_o$. When the pulses are terminated, the polarized nuclei experience a magnetic field only from $H_o$ which causes the polarization to precess about $H_o$. This in turn induces a current in coil 60 which is provided to RF receiving means 40 where it is compared with the reference voltage (or combined with the reference voltage) to provide a signal representative of the quantity of oil in the core in test cell 9.

In that the neclei under observation are protons, it is necessary to eliminate the contribution to the induced Rf signal of the protons in the water phase within the core. This can be accomplished by dissolving paramagnetic salts in the aqueous phase before injection into the core. The polarization of the aqueous protons will then decay more rapidly than that of the oil protons. Acquisition of the induced signal is then delayed until after the aqueous polarization decays.

Figure 3:
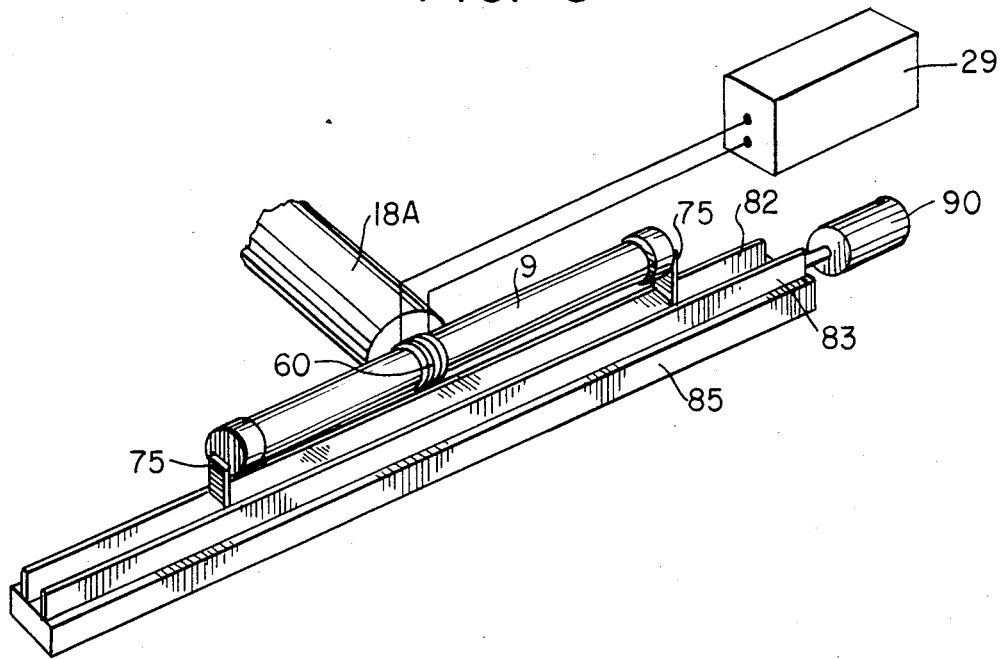
FIG. 3 is a simplified mechanical diagram of a core analyzer constructed in accordance with the present invention.

Another aspect would be to determine the efficiency as a flood system by determining the oil saturations at various locations along the length of test cell 9. For this type of testing, test cell 9 should have a suitable length; a typical length may be four feet. This type of testing may be accomplished by an arrangement where in essence test cell 9 and coil 60 are moved in relation to each other. However, a preferred approach is to move test cell 9 as is shown in FIG. 3. Illustrated in FIG. 3 is the electronics package 29, only one pole 18A of electromagnet 17 is shown for ease of understanding, coil 60 and test cell 9. Test cell 9 is mounted on brackets which slide along rails 82 and 83 mounted on member 85. Coil 60 is embedded in a material such a lucite to give it rigidity. This in turn may be mounted to a stationary object such as the electromagnet yoke. Test cell 9 is moved in one linear direction by a drive screw (not shown) turned in one direction. Test cell 9 moves in an opposite linear direction when the drive screw is turned in an opposite direction.

The screw drive may be driven by motor means 90 which may be a stepping motor, that is, it will turn the screw drive a predetermined number of turns so as to move test cell 9 a predetermined linear distance until motor means 90 is activated again. The system would be operated at each new location to make measurements. In operation, the core in test cell 9 is filled with oil and readings made at predetermined locations. The drive fluid will then be pumped into it at a predetermined rate. Test cell 9 will then be repeatedly moved to the predetermined locations to take readings at each location and in this way with the slow movement of the drive fluid passing through test cell 9 the front of the drive fluid may be mapped over a period of time.

In the absence of aqueous phase paramagnetic ions, the total fluid content within the core in test cell 9 may be observed, giving a measure of core porosity. With paramagnetic ions present in the aqueous phase, only the hydrocarbon content of the core is observed. Thus oil saturation of the core can be observed directly.

The present invention as hereinbefore described is a core flood analyzer utilizing nuclear magnetic resonance to directly determine oil saturation in a core of material so as to test core flood chemicals.

What is claimed is:

1. A core analyzer comprising:
test cell means for containing a core of earthen material, said core having a length suitable for monitoring of fluid moving through the core;
means for providing at least two fluids to the test cell means in such a manner that a first fluid fills the core in the test cell means and a second fluid displaces at least a portion of the first fluid, and
means for using nuclear magnetic resonance to monitor the saturation of the core with the first fluid and to monitor the displacing movement of the second fluid.

2. A core analyzer as described in claim 1 in which the nuclear magnetic resonance means includes;
an electromagnet having poles arranged with the test cell means so that a portion of the test cell means is between the poles of the electromagnet,
a coil encircling a portion of the test cell means between the poles,
means for energizing the coil with pulses of RF energy, and
means for monitoring the decay characteristics of the RF energy after each pulse.

3. A core analyzer as described in claim 2 further comprising:
moving means for changing the spatial relationship between the electromagnet, the coil and the test cell means so that readings may be made for each arrangement.

4. A core analyzer as described in claim 3 in which the electromagnet and the coil remain stationary while the test cell means is moved to achieve the changing spatial relationship.

5. A core analyzer as described in claim 4 in which the moving means includes;

a drive screw to which the test cell means is fixed in a manner so that as the drive screw rotates the test cell will move in a linear direction, and stepper motor means mechanically connected to the drive screw for turning the drive screw through a predetermined rotation for each step of the stepper motor means so that test cell 9 moves a predetermined distance through the coil.

6. An analyzer as described in claim 5 in which the pulse means includes;

a computer, a source of RF energy, pulse programming means receiving the RF energy and connected and controlled by the computer to provide the RF energy and a pulse signal, gated RF amplifier means connected to the computer and to the pulse programming means for providing the pulses of RF energy in accordance with the RF energy and the pulse signal from the pulse programmer means and providing a signal back to the computer indicating occurrences of the pulses of energy.

7. An analyzer as described in claim 6 in which the monitoring means includes;

RF receiving means connected to one end of the coil and to the pulse programming means for receiving a reference RF signal from the pulse programming means and the current passing through the coil, and means for providing a readout in accordance with the reference RF signal and the current received by the RF receiving means.

8. A flood core analyzing method comprising the steps of:

containing a core of earthen material in a test cell, said core having a length suitable for monitoring of fluid moving through the core;

filling the core with a first fluid in the test cell, displacing at least a portion of the first fluid with a second fluid, and using nuclear magnetic resonance to monitor the saturation of the core with the first fluid and to monitor the displacing movement of the second fluid.

9. A method as described in claim 8 in which the nuclear magnetic resonance use step includes;

arranging an electromagnet having poles with the test cell so that a portion of the test cell is between the poles of the electromagnet, encircling a portion of the test cell between the poles with a coil, energizing the coil with pulses of RF energy, and monitoring the decay characteristics of the RF energy after each pulse.

10. A method as described in claim 9 further comprising the step of:

changing the spatial relationship between the electromagnet, the coil and the test cell so that a reading may be made for each arrangement.

11. A method as described in claim 10 in which during the changing step the electromagnet and the coil remain stationary while the test cell is moved to achieve the changing spatial relationship.

12. A method as described in claim 11 in which the changing step includes;

rotating a drive screw to which the test cell is fixed in a manner so that as the drive screw rotates the test cell will move in a linear direction, and turning the drive screw with a stepper motor, mechanically connected to the drive screw, through a predetermined rotation for each step of the stepper motor so that test cell moves a predetermined distance through the coil.

13. A method as described in claim 12 in which the monitoring step includes;

receiving a reference RF signal from the pulse programming means, receiving the current passing through the coil, and providing a readout in accordance with the received reference RF signal and the received current.

* * * * *